United States Patent
Chiu et al.

(10) Patent No.: US 10,062,704 B2
(45) Date of Patent: Aug. 28, 2018

(54) BURIED-CHANNEL MOSFET AND A SURFACE-CHANNEL MOSFET OF A SAME TYPE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Tzu Yin Chiu, Shanghai (CN); Clifford Ian Drowley, Shanghai (CN); Leong Tee Koh, Shanghai (CN); Yu Lei Jiang, Shanghai (CN); Da Qiang Yu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 16 days.

(21) Appl. No.: 15/394,592

(22) Filed: Dec. 29, 2016

(65) Prior Publication Data
US 2017/0194339 A1     Jul. 6, 2017

(30) Foreign Application Priority Data
Dec. 30, 2015 (CN) .......................... 2015 1 1021410

(51) Int. Cl.
*H01L 21/8234* (2006.01)
*H01L 27/11531* (2017.01)
(Continued)

(52) U.S. Cl.
CPC ...... *H01L 27/11531* (2013.01); *H01L 21/266* (2013.01); *H01L 21/26513* (2013.01);
(Continued)

(58) Field of Classification Search
CPC ......... H01L 27/11534; H01L 27/11531; H01L 27/11521; H01L 27/1159; H01L 27/088;
(Continued)

(56) References Cited

U.S. PATENT DOCUMENTS

| 5,498,555 A | 3/1996 | Lin |
| 6,100,568 A * | 8/2000 | Lage ...................... H01L 27/11 257/371 |

(Continued)

OTHER PUBLICATIONS

Konstantin D. Stefanov et al.,"Performance of Deep-Depletion Buried-Channel n-MOSFETs for CMOS Image Sensors," IEEE Transactions on Electron Devices, vol. 60, No. 12, Dec. 2013. pp. 4173-4179.

(Continued)

*Primary Examiner* — Michael Trinh
(74) *Attorney, Agent, or Firm* — Anova Law Group, PLLC (57) ABSTRACT

A method is provided for fabricating a buried-channel MOSFET and a surface-channel MOSFET of the same type and different gate electrodes on a same wafer. The method includes providing a semiconductor substrate having a well area and a plurality of shallow trench isolation structures; forming a threshold implantation region doped with impurity ions opposite of that of the well area in the well area for the buried-channel MOSFET; forming a gate structure including a gate dielectric layer and a gate electrode on the semiconductor substrate, wherein the gate electrode of the buried-channel MOSFET is doped with impurity ions with a same type as that of the well area, and the gate electrode of the surface-channel MOSFET is doped with impurity ions (Continued)

with a type opposite of that of the well area; and forming source and drain regions in the semiconductor substrate at both sides of the gate structure.

17 Claims, 5 Drawing Sheets

(51) Int. Cl.

| | |
|---|---|
| *H01L 21/265* | (2006.01) |
| *H01L 21/266* | (2006.01) |
| *H01L 21/3213* | (2006.01) |
| *H01L 21/762* | (2006.01) |
| *H01L 21/8238* | (2006.01) |
| *H01L 27/092* | (2006.01) |
| *H01L 27/11524* | (2017.01) |
| *H01L 29/04* | (2006.01) |
| *H01L 29/06* | (2006.01) |
| *H01L 29/08* | (2006.01) |
| *H01L 29/10* | (2006.01) |
| *H01L 29/16* | (2006.01) |
| *H01L 29/161* | (2006.01) |
| *H01L 29/167* | (2006.01) |
| *H01L 29/66* | (2006.01) |

(52) U.S. Cl.
CPC .. *H01L 21/32139* (2013.01); *H01L 21/76224* (2013.01); *H01L 21/82345* (2013.01); *H01L 21/823412* (2013.01); *H01L 21/823418* (2013.01); *H01L 21/823807* (2013.01); *H01L 21/823814* (2013.01); *H01L 21/823828* (2013.01); *H01L 21/823864* (2013.01); *H01L 21/823878* (2013.01); *H01L 27/0922* (2013.01); *H01L 27/11524* (2013.01); *H01L 29/04* (2013.01); *H01L 29/0649* (2013.01); *H01L 29/0688* (2013.01); *H01L 29/0847* (2013.01); *H01L 29/1033* (2013.01); *H01L 29/1083* (2013.01); *H01L 29/1095* (2013.01); *H01L 29/161* (2013.01); *H01L 29/167* (2013.01); *H01L 29/1608* (2013.01); *H01L 29/66825* (2013.01)

(58) Field of Classification Search
CPC ............. H01L 27/0617; H01L 27/7938; H01L 29/1033; H01L 29/1083; H01L 29/66825; H01L 29/0847; H01L 29/4916; H01L 29/6656; H01L 21/823412; H01L 21/82345; H01L 21/823418; H01L 21/823468; H01L 21/823814; H01L 21/823828; H01L 21/823878; H01L 21/823864
See application file for complete search history.

(56) References Cited

U.S. PATENT DOCUMENTS

| | | | |
|---|---|---|---|
| 6,337,248 B1 * | 1/2002 | Imai | ................ H01L 21/82384 257/E21.637 |
| 6,747,318 B1 | 6/2004 | Kapre et al. | |
| 2003/0025165 A1 | 2/2003 | Kim et al. | |
| 2013/0221418 A1 * | 8/2013 | Mitchell | ........... H01L 27/11517 257/296 |

OTHER PUBLICATIONS

Shang-Yi Chiang et al. "Optimization of Sub-Micron P-Channel FET Structure", IEDM 1983_01483686 pp. 534-539.

Yue Chen et al. "A CMONS Image Sensor With In-Pixel Buried-Channel Source Follower and Optimized Row Selector", IEEE Transactions on Electron Devices, vol. 56 No. 11, Nov. 2009 pp. 2390-2397.

L.C. Parrillo et al. "A Fine-Line CMOS Technology That Uses P+ Polycillicon/Silicide Gates for NMOS and PMOS Divices", IEDM 1984 pp. 418-422.

Hideo Sunami "Charateristics of a Buried-Channel Graded Drain with Punchthrough Stopper (BGP) MOS Device", IEEE Transactions on Electron Devices, vol. ED-29, No. 4, Apr. 1982 pp. 607-610.

\* cited by examiner

BURIED-CHANNEL MOSFET AND A SURFACE-CHANNEL MOSFET OF A SAME TYPE AND FABRICATION METHOD THEREOF

CROSS-REFERENCES TO RELATED APPLICATIONS

This application claims the priority of Chinese patent application No. 201511021410.5, filed on Dec. 30, 2015, the entirety of which is incorporated herein by reference.

FIELD OF THE INVENTION

The present invention generally relates to the field of semiconductor manufacturing and, more particularly, relates to a buried-channel MOSFET and a surface-channel MOSFET of a same type, and fabrication method of the MOSFETs.

BACKGROUND

The metal-oxide-semiconductor (MOS) field-effect transistor (FET) is the fundamental device in semiconductor manufacturing and has been widely used in various types of integrated circuit. Based on the type of main carriers and doping type during fabrication, FETs can be divided into two types: NMOS FET and PMOS FET. The main carriers in NMOS FETs are electrons and the main carriers in PMOS FETs are holes.

The existing techniques provide a method for fabricating MOSFET. The method includes providing a semiconductor substrate, and forming isolation structures on the semiconductor substrate. The semiconductor substrate between isolation structures has active areas; and well areas are formed in the active areas (not labeled). The method also includes doping the surface of the well areas with impurity ions by a first ion implantation process to adjust the threshold voltage of the subsequently formed MOSFET; sequentially forming a gate dielectric layer and a gate electrode on the semiconductor substrate between the isolation structures, where the gate dielectric layer and the gate electrode constitute a gate structure; forming an oxide layer covering the gate structure by an oxidation process; and forming source and drain extension regions in the semiconductor substrate at both sides of the gate structure by a shallow ion implantation process. Further, the method includes using the gate structure as a mask to perform a deep ion implantation process in the well areas at both sides of the gate structure, where the energy and dose of the deep ion implantation is larger than the energy and dose of the shallow ion implantation; and forming a source region and a drain region in the well areas at both sides of the gate structure, where the depth of the source and drain regions is larger than the depth of the source and drain extension regions.

However, the performance of such MOSFET fabricated with existing techniques needs to be improved. The disclosed device structures and methods are directed to solve one or more problems set forth above and other problems.

BRIEF SUMMARY OF THE DISCLOSURE

One aspect of the present disclosure includes a method for fabricating a buried-channel metal-oxide-semiconductor field-effect transistor (MOSFET) and a surface-channel metal-oxide-semiconductor field-effect transistor (MOSFET) of the same type and different gate electrodes on a same wafer, including: providing a semiconductor substrate for each buried-channel and surface-channel MOSFETs; forming a well area and a plurality of shallow trench isolation structures in the semiconductor substrate for each buried-channel and surface-channel MOSFETs; forming a threshold implantation region in the well area for the buried-channel MOSFET, wherein a type of doped impurity ions in the threshold implantation region is opposite of a type of doped impurity ions in the well area, and a depth of the threshold implantation region is smaller than a depth of the well area; forming a gate structure on a surface of the semiconductor substrate for each buried-channel and surface-channel MOSFETs, wherein the gate structure includes a gate dielectric layer and a gate electrode above the gate dielectric layer, the gate electrode of the buried-channel MOSFET is doped with impurity ions and a type of doped impurity ions in the gate electrode of the buried-channel MOSFET is the same as the type of doped impurity ions in the well area, and a type of doped impurity ions in the gate electrode of the surface-channel MOSFET is opposite of the type of doped impurity ions in the well area; and forming a source region and a drain region in the semiconductor substrate at both sides of the gate structure for each buried-channel and surface-channel MOSFETs, wherein a type of doped impurity ions in the source and drain regions is opposite of the type of doped impurity ions in the well area, and a depth of the source and drain regions is smaller than the depth of the well area and larger than the depth of the threshold implantation region.

Another aspect of the present disclosure includes a buried-channel MOSFET and a surface-channel MOSFET of a same type and different gate electrodes on a same wafer, comprising: a semiconductor substrate having a well area and a plurality of shallow trench isolation structures for each buried-channel and surface-channel MOSFETs; a threshold implantation region formed in the well area of the buried-channel MOSFET, wherein a type of doped impurity ions in the threshold implantation region of the buried-channel MOSFET is opposite of a type of doped impurity ions in the well area and a depth of the threshold implantation region is smaller than a depth of the well area; a gate structure formed on a surface of the semiconductor substrate for each buried-channel and surface-channel MOSFETs, wherein the gate structure includes a gate dielectric layer and a gate electrode above the gate dielectric layer, the gate electrode of the buried-channel MOSFET is doped with impurity ions and a type of doped impurity ions in the gate electrode of the buried-channel MOSFET is the same as the type of doped impurity ions in the well area, and a type of doped impurity ions in the gate electrode of the surface-channel MOSFET is opposite of the type of doped impurity ions in the well area; and a source region and a drain region formed in the semiconductor substrate at both sides of the gate structure for each buried-channel and surface-channel MOSFETs, wherein a type of doped impurity ions in the source and drain regions is opposite of the type of doped impurity ions in the well area and a depth of the source and drain regions is smaller than the depth of the well area and larger than the depth of the threshold implantation region.

Other aspects of the present disclosure can be understood by those skilled in the art in light of the description, the claims, and the drawings of the present disclosure.

DETAILED DESCRIPTION

As explained in the background section, the performance of MOSFET fabricated with existing techniques needs to be improved. For example, the existing transistor has flicker noise (1/f noise) or random telegraph noise (RTN) during operation. The occurrence of the flicker noise (1/f noise) or random telegraph noise (RTN) is largely related to charge trapping/de-trapping from near-surface traps, which affects the threshold voltage of the device locally and causes current fluctuations, and is also related to the surface smoothness of the conducting channel, which significantly affects mobility. The conducting channel in existing MOSFET is substantially the surface channel. In the fabrication process, it is hard to ensure the charge traps and smoothness of the substrate surface, and defects may inevitably exist on the substrate surface. The presence of defects can affect the carrier transport and, therefore, when such existing MOSFET is in operation, the flicker noise or the random telegraph noise can appear and the noise performance of MOSFET is affected.

According to the disclosed device structures and methods, the conducting channel charge traps and smoothness issues and the other issues may be overcome by making a buried-channel to avoid the influence of defects on the semiconductor substrate. The buried channel device reduces the susceptibility to variation from the traps, and also affects mobility.

In many electronic circuit applications, both digital circuits and analog circuits are present, so as to form a mixed-signal circuit. The surface-channel MOSFET may be configured to optimize the performance of digital circuits (e.g., switching speed), and the buried-channel MOSFET may be configured to optimize the noise performance of certain analog circuits. Therefore, forming both the surface-channel and buried-channel MOSFETs of the same type is desirable in such mixed-signal circuit.

In the existing techniques, different channel implantations may be performed to form the surface-channel and buried-channel MOSFETs. Therefore, the conducting region in the buried-channel MOSFET is kept away from the surface. In addition, different gate materials (with different work function) may be provided to form the surface-channel and buried-channel MOSFETs. By providing gate materials with different work function, parameters, such as threshold voltage, and saturation current, etc., of the buried-channel and surface-channel MOSFETs can be easily optimized, respectively.

When polysilicon gate electrodes are used to form the MOSFET, the gate work function is set by the gate doping. The gate doping is usually either done by simultaneously implanting the gate and the source and drain regions of the transistor with one dopant type, or by doping the gate electrode material layer, and then doping the source and drain regions of the transistor by an ion implantation process after patterning the gate electrode. In both cases, the gate doping type for both surface-channel and buried-channel MOSFETs is the same (e.g., either p-type or n-type).

It is desirable to separate the doping of the gate and the doping of the source and drain regions, thus p-type gate and n-type gate can be formed for the same type of transistor (e.g., either NMOS or PMOS). Therefore, the performance of the digital circuit can be improved by using the surface-channel MOSFET, and the noise performance of the analog circuit can be improved by using the buried-channel MOSFET. In addition, the packing density of transistors is a key factor in circuit size and manufacturing cost. Therefore, it is desirable to improve packing density for the circuits.

Reference will now be made in detail to exemplary embodiments of the invention, which are illustrated in the accompanying drawings. Wherever possible, the same reference numbers will be used throughout the drawings to refer to the same or the alike parts.

Figure 7:
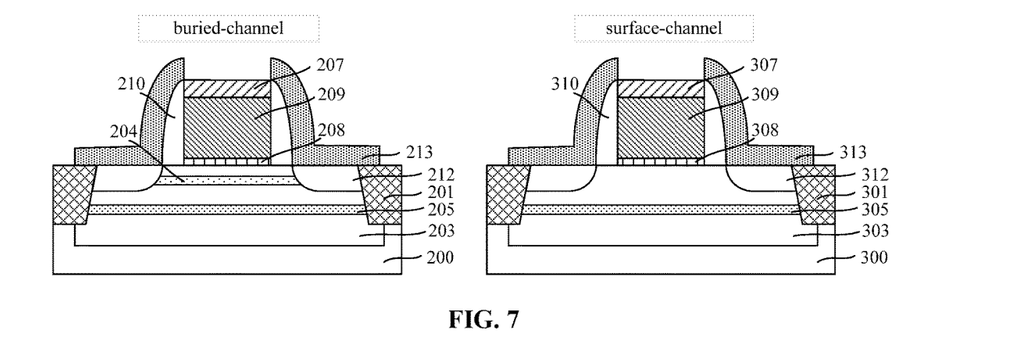
Figure 8:
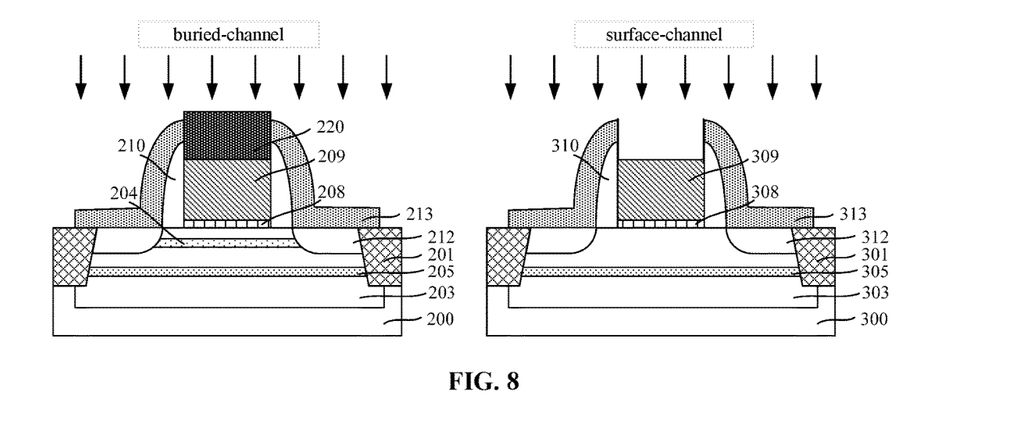
Figure 9:
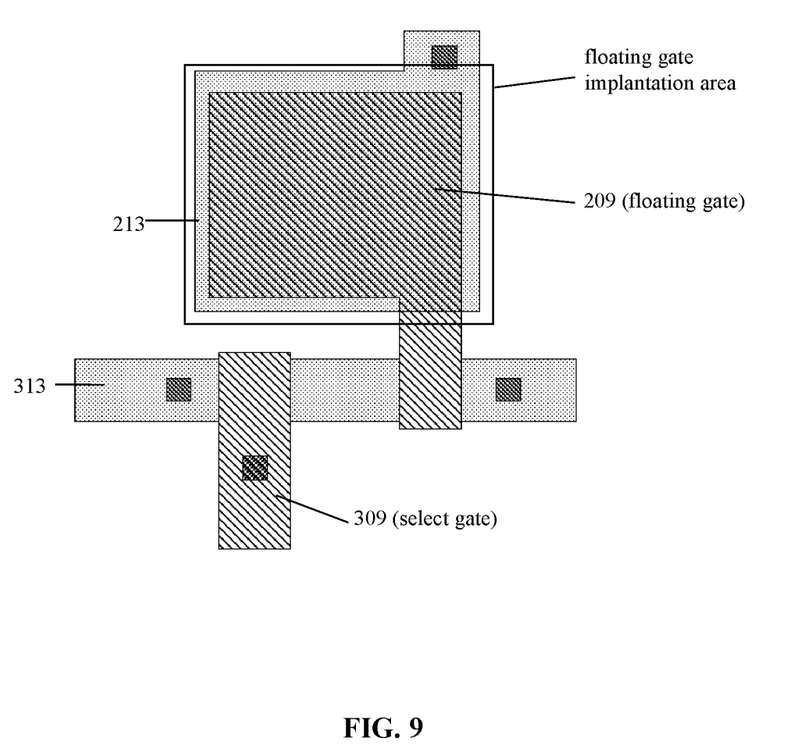
FIG. 9 illustrates a schematic of forming a floating-gate memory with a gate electrode of a buried-channel MOSFET as a floating-gate material.

The present disclosure provides a buried-channel MOSFET and a surface-channel MOSFET of the same type and different gate electrodes on the same wafer. FIG. 9 illustrates an exemplary fabrication process to form both buried-channel and surface-channel MOSFETs consistent with the disclosed embodiments; and FIGS. 1-9 illustrate semiconductor structures corresponding to certain stages of the exemplary fabrication process.

Figure 1:
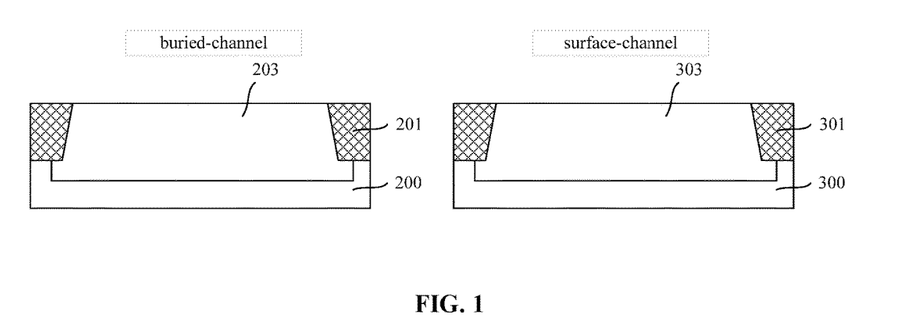
FIGS. 1-8 each illustrates semiconductor structures corresponding to a certain stage of a fabrication process of a buried-channel MOSFET and a surface-channel MOSFET consistent with the disclosed embodiments.
Figure 10:
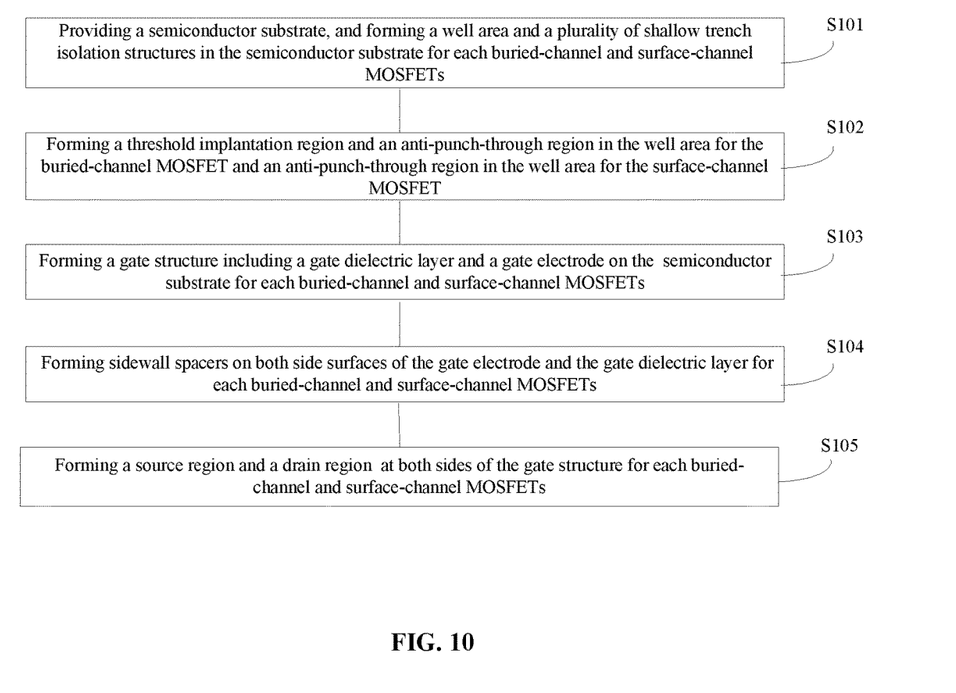
FIG. 10 illustrates an exemplary fabrication process of a buried-channel MOSFET and a surface-channel MOSFET consistent with the disclosed embodiments.

As shown in FIG. 10, at the beginning of the fabrication process, for both buried-channel and surface-channel MOSFETs, a semiconductor substrate may be provided, and a well area and a plurality of shallow trench isolation structures may be formed in the semiconductor substrate (S101). FIG. 1 illustrates a corresponding semiconductor structure.

Referring to FIG. 1, for a buried-channel MOSFET (a surface-channel MOSFET), a semiconductor substrate 200 (300) may be provided and a well area 203 (303) may be formed in the semiconductor substrate 200 (300). For illustrative purposes, the labeling number in the brackets refer to the elements in the surface-channel MOSFET in the figures.

The semiconductor substrate 200 (300) may include any appropriate semiconductor materials, such as silicon (Si), germanium (Ge), germanium-silicon alloy (GeSi), silicon carbide (SiC), silicon on insulator (SOI), germanium on insulator (GOI), or gallium arsenide (GaAs) and other III-V compounds thereof. In one embodiment, the semiconductor substrate 200 may be silicon.

For the buried-channel MOSFET (the surface-channel MOSFET), the well area 203 (303) may be formed by performing an ion implantation process onto the semiconductor substrate 200 (300). According to different types of the formed MOSFET, the well area 203 (303) may be doped with different types of impurity ions. Specifically, when the formed MOSFET is an N-type FET, the type of doped impurity ions in the well area may be P-type. The P-type impurity ion may be one or more of boron ion, gallium ion and indium ion. When the formed MOSFET is a P-type FET, the type of doped impurity ions in the well area may be N-type. The N-type impurity ion may be one or more of phosphorus ion, arsenic ion and antimony ion.

Further, as shown in FIG. 1, a plurality of shallow trench isolation structures 201 (301) may be formed in the semiconductor substrate 200 (300). The shallow trench isolation structures 201 (301) may be configured to isolate the adjacent active areas. In one embodiment, a fabrication process of the shallow trench isolation structures 201 (301) may include: etching the semiconductor substrate to form notches; and filling the notches with isolation materials to form the shallow trench isolation structures.

In another embodiment, the fabrication process of the shallow trench isolation structures 201 (301) may also include: forming a liner layer on surfaces of both sides and bottom of the notches before filling the notches with isolation materials, and then forming isolation material layer for filling the notches on the liner layer. The liner layer can be made of any appropriate material, such as silicon oxide, silicon nitride, or silicon oxynitride, etc. The isolation material layer can be made of any appropriate material, such as silicon oxide, silicon oxynitride, or silicon-carbon oxide, etc.

Figure 2:
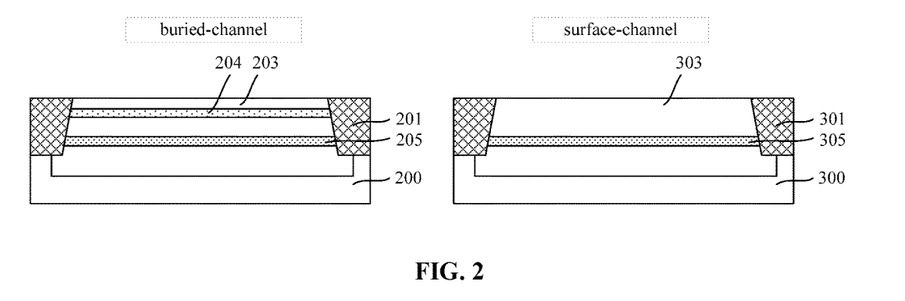

Returning to FIG. 10, after forming the well area and the shallow trench isolation structures in the semiconductor substrate, a threshold implantation region and an anti-punch-through region may be formed in the well area for the buried-channel MOSFET, and an anti-punch-through region may be formed in the well area for the surface-channel MOSFET (S102). FIG. 2 illustrates a corresponding semiconductor structure.

Referring to FIG. 2, for the buried-channel MOSFET, a threshold implantation region 204 may be formed in the well area 203. The type of doped impurity ions in the threshold implantation region 204 may be opposite of the type of doped impurity ions in the well area 203 and the depth of the threshold implantation region 204 may be smaller than the depth of the well area 203.

The threshold implantation region 204 may be formed by an ion implantation process. Before performing the ion implantation process, a mask layer may be formed on the surface of the surface-channel MOSFET. The type of doped impurity ions in the threshold implantation region 204 may be opposite of the type of doped impurity ions in the well area 203. Specifically, when the formed MOSFET is an N-type FET, the type of doped impurity ions in the well area 203 may be P-type and the type of doped impurity ions in the threshold implantation region 204 may be N-type. The N-type impurity ion may be one or more of phosphorus ion, arsenic ion, and antimony ion. When the formed MOSFET is a P-type FET, the type of doped impurity ions in the well area 203 may be N-type and the type of doped impurity ions in the threshold implantation region 204 may be P-type. The P-type impurity ion may be one or more of boron ion, gallium ion, and indium ion.

As shown in FIG. 2, the depth of the threshold implantation region 204 may be smaller than the depth of the well area 203. The threshold implantation region 204 may be located between the surface of the semiconductor substrate 200 and the bottom of the well area 203. The distance between the threshold implantation region 204 and the surface of the semiconductor substrate 200 may be smaller than the distance between the threshold implantation region 204 and the bottom of the well area 203. Therefore, the threshold implantation region 204 may be located inside the semiconductor substrate 200, and both regions above and below the threshold implantation region 204 may be well areas with opposite doping types. A PN junction can be formed in the contact area between the threshold implantation region 204 and the well area 203.

After subsequently forming a gate electrode, when an operating voltage is applied onto the gate electrode, an inversion region can be formed in the area near the PN junction. Because the barrier of the area near the PN junction may be smaller than the barrier of the surface of the semiconductor substrate, carriers can transport in the inversion region formed in the area near the PN junction. Therefore, the transport channel of carriers in MOSFET fabricated with methods in the present disclosure may be located below the surface of the semiconductor substrate, and the transport of carriers are less affected by defects existed on the surface of the semiconductor substrate, reducing the occurrence of flicker noise and improving the performance of devices.

In the present disclosure, the depth of the threshold implantation region 204 is the vertical distance between the bottom of the threshold implantation region 204 and the surface of the semiconductor substrate 200. The depth of the well area 203 is the vertical distance between the bottom of the well area 203 and the surface of the semiconductor substrate 200. The definition of the depth of the subsequently formed anti-punch-through region and source and drain regions is similar. The width of the threshold implantation region 204 may be larger than the width of the subsequently formed gate electrode. After forming the threshold implantation region 204 for the buried-channel MOSFET, the mask layer formed on the surface of the surface-channel MOSFET may be removed.

Further, as shown in FIG. 2, for the buried-channel MOSFET (surface-channel MOSFET), before forming a gate dielectric layer and a gate electrode, the method may also include forming an anti-punch-through region 205 (305) in the well area 203 (303). The type of doped impurity ions in the anti-punch-through region 205 (305) may be the same as the type of doped impurity ions in the well area 203 (303), and the depth of the anti-punch-through region 205 (305) may be larger than the depth of the threshold implantation region 204 and smaller than the depth of the well area 203 (303).

In one embodiment, when the formed MOSFET is an N-type FET, the type of doped impurity ions in the well area 203 (303) may be P-type and the type of doped impurity ions in the anti-punch-through region 205 (305) may also be P-type. The P-type impurity ion may be one or more of boron ion, gallium ion, and indium ion. In another embodiment, when the formed MOSFET is P-type FET, the type of doped impurity ions in the well area 203 (303) may be N-type and the type of doped impurity ions in the anti-punch-through region 205 (305) may also be N-type. The N-type impurity ion may be one or more of phosphorus ion, arsenic ion, and antimony ion.

Figure 3:
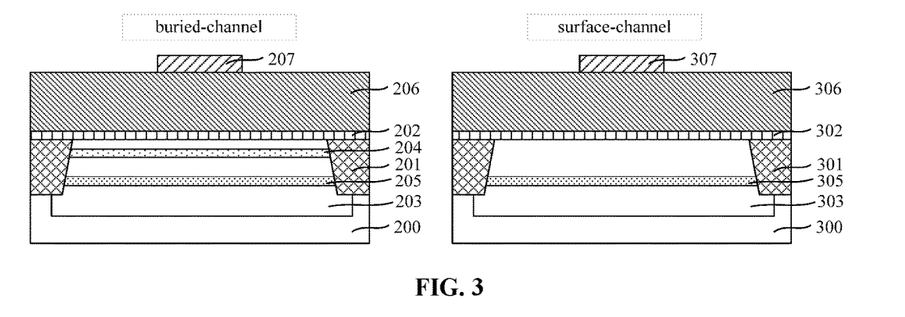
Figure 4:
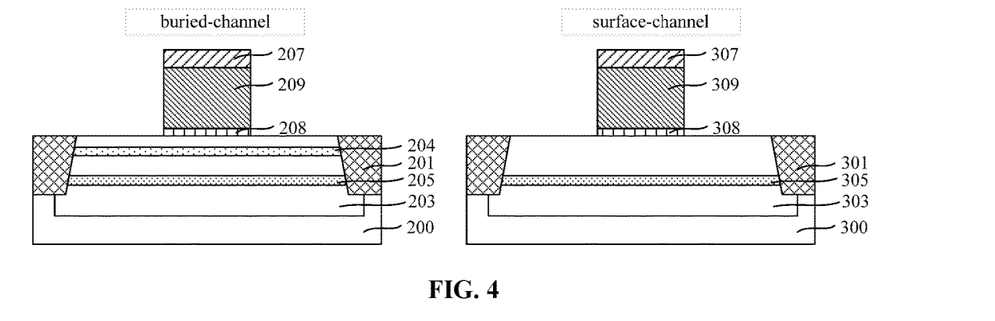

Returning to FIG. 10, for both buried-channel and surface-channel MOSFETs, after forming the threshold implantation region and/or the anti-punch-through region, a gate structure including a gate dielectric layer and a gate electrode may be formed on the surface of the semiconductor substrate (S103). FIGS. 3 and 4 illustrate the corresponding semiconductor structures.

Referring to FIGS. 3 and 4, for the buried-channel MOSFET (surface-channel MOSFET), a gate structure may be formed on the surface of the semiconductor substrate 200 (300) above the threshold implantation region 204 (the anti-punch-through region 205). The gate structure may include a gate dielectric layer 208 (308) and a gate electrode 209 (309) above the gate dielectric layer 208 (308). The gate electrode 209 (309) may be doped with impurity ions and the type of doped impurity ions in the gate electrode 209 (309) may be the same as the type of doped impurity ions in the well area 203 (303).

As shown in FIG. 3, for the buried-channel MOSFET (the surface-channel MOSFET), a fabrication process of forming the gate dielectric layer 208 (308) and the gate electrode 209 (309) may include: forming a gate dielectric material layer 202 (302) on the semiconductor substrate 200 (300); forming a gate electrode material layer 206 (306) on the gate dielectric material layer 202 (302); forming a patterned hard mask layer 207 (307) on the gate electrode material layer 206 (306); and using the patterned hard mask layer 207 (307) as a mask to etch the gate electrode material layer 206 (306) and the gate dielectric material layer 202 (302) to form the gate dielectric layer 208 (308) and the gate electrode 209 (309) on the semiconductor substrate 200 (300).

For the buried-channel MOSFET (the surface-channel MOSFET), the gate dielectric material layer 202 (302) can be made of any appropriate material, such as silicon oxide, silicon nitride, or silicon oxynitride, etc. In one embodiment, the gate dielectric material layer 202 (302) may be made of silicon oxide. The gate dielectric material layer 202 (302) can be formed by a silicon thermal oxidation process, or a chemical vapor deposition process, etc. The gate electrode material layer 206 (306) can be made of any appropriate material, such as polysilicon, or metal, etc. In one embodiment, the gate electrode material layer 206 (306) may be made of polysilicon. The gate electrode material layer 206 (306) may be formed by a chemical vapor deposition process.

For the buried-channel MOSFET, the gate electrode material layer 206 may be doped with impurity ions by an ion implantation process. Before performing the ion implantation process, a photoresist layer may be formed on the gate electrode material layer 306 of the surface-channel MOSFET. Therefore, the ion implantation process may be performed only on the gate electrode material layer 206 of the buried-channel MOSFET. In other words, only the gate electrode material layer 206 of the buried-channel MOSFET may be doped with impurity ions. The type and concentration of doped impurity ions in the gate electrode material layer 206 may be the type and concentration of doped impurity ions in the subsequently formed gate electrode 209.

The type of doped impurity ions in the gate electrode 209 may be the same as the type of doped impurity ions in the well area 203. In other words, the type of doped impurity ions in the gate electrode 209 may be opposite of the type of doped impurity ions in the MOSFET. In one embodiment, when a buried-channel N-type MOSFET is formed, a P-type gate electrode may be formed. In another embodiment, when a buried-channel P-type MOSFET is formed, an N-type gate electrode may be formed. It is clearly different from the existing MOSFET, where the type of doped impurity ions in the gate electrode may be the same as the type of doped impurity ions in the MOSFET. The purpose to do so in the present disclosure is that the threshold implantation region 204 may be formed in the well area 203 at the bottom of the gate electrode. The doping type of the threshold implantation region 204 may be opposite of the doping type of the well area 203, such that the existence of the threshold implantation region 204 may have large influence on the threshold voltage of the MOSFET. The type of doped impurity ions in the gate electrode 209 may be opposite of the type of doped impurity ions in the threshold implantation region 204 (or the same as the type of doped impurity ions in the well area 203). Thus, the threshold voltage of the formed MOSFET can be adjusted. In addition, either the surface-channel or the buried-channel MOSFET of the same type (e.g., NMOS or PMOS) may be formed by using the combination of different gate-electrode doping type and threshold implant doping type and dose.

The concentration of doped impurity ions in the gate electrode 209 may be positively correlated with the concentration of doped impurity ions in the threshold implantation region 204. That is, the larger the concentration of doped impurity ions in the threshold implantation region 204, the larger the concentration of doped impurity ions in the gate electrode 209.

After doping the gate electrode material layer 206 of the buried-channel MOSFET with impurity ions, and before forming the patterned hard mask layer 207 (307), the photoresist layer formed on the gate electrode material layer 306 of the surface-channel MOSFET may be removed. The patterned hard mask layer 207 (307) may have a single layer or multilayer (≥2 layers) stacked structure and be made of any appropriate material, such as silicon nitride, silicon oxynitride, or silicon carbide, etc.

Figure 5:
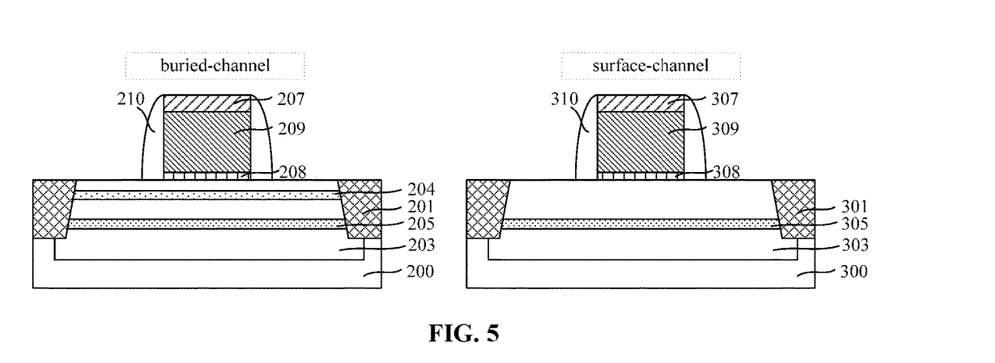

Returning to FIG. 10, after forming the gate structure including the gate dielectric layer and the gate electrode, for both buried-channel and surface-channel MOSFETs, sidewall spacers may be formed on both side surfaces of the gate electrode and the gate dielectric layer (S104). FIG. 5 illustrates a corresponding semiconductor structure.

Referring to FIG. 5, for the buried-channel MOSFET (surface-channel MOSFET), the sidewall spacers 210 (310) may be formed on both side surfaces of the gate electrode 209 (309) and the gate dielectric layer 208 (308).

As shown in FIG. 5, for the buried-channel MOSFET (the surface-channel MOSFET), a fabrication process of forming the sidewall spacers 210 (310) may include: forming a sidewall spacer material layer covering the surface of the semiconductor substrate, both side surfaces of the gate electrode 209 (309) and the gate dielectric layer 208 (308), and the side and top surfaces of the patterned hard mask layer 207 (307); and etching the sidewall spacer material layer by a maskless plasma etching process to form sidewall spacers 210 (310) on both side surfaces of the gate electrode 209 (309) and the gate dielectric layer 208 (308). The sidewall spacers 210 (310) may also cover both side surfaces of the patterned hard mask layer 207 (307).

The sidewall spacers 210 (310) may be a part of the gate structure. The sidewall spacers 210 (310) may be made of any appropriate materials, such as silicon oxide, silicon nitride, silicon oxynitride, or silicon nitride carbide, etc.

The sidewall spacers 210 (310) may have a single layer or multilayer 2 layers) stacked structure. In one embodiment, the sidewall spacers 210 (310) may have a two-layer stacked structure, including first sidewall spacers formed on both side surfaces of the gate electrode 209 (309) and the gate dielectric layer 208 (308), and second sidewall spacers formed on the surfaces of the first sidewall spacers. The first sidewall spacers and the second sidewall spacers may be made of different materials.

Figure 6:
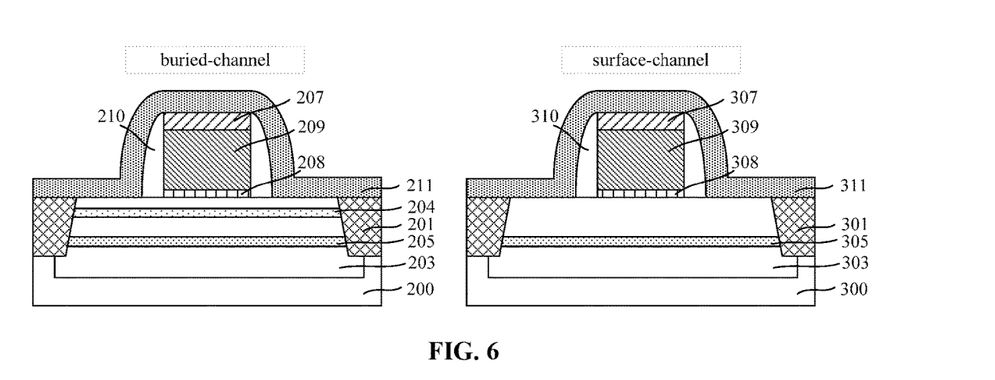

Returning to FIG. 10, after forming the sidewall spacers, for both buried-channel and surface-channel MOSFETs, a source region and a drain region may be formed in the semiconductor substrate at both sides of the gate structure (S105). FIGS. 6-8 illustrate the corresponding semiconductor structures.

Referring to FIGS. 6-8, for both buried-channel and surface-channel MOSFETs, a source region and a drain region may be formed in the semiconductor substrate at both sides of the gate structure. The type of doped impurity ions in the source and drain regions may be opposite of the type of doped impurity ions in the well area and the depth of the source and drain regions may be smaller than the depth of the well area and larger than the depth of the threshold implantation region.

In one embodiment, for the buried-channel MOSFET (surface-channel MOSFET), a fabrication process of forming the source and drain regions may include: forming a semiconductor material layer 211 (311) covering the semiconductor substrate, the gate structure and the patterned hard mask layer 207 (307) above the gate structure; etching the semiconductor material layer 211 (311) formed on the surface of the patterned hard mask layer 207 (307) and portions of the semiconductor material layer 211 (311) formed on the semiconductor substrate 200 (300); forming source and drain material layer 213 (313) on the surfaces of the sidewall spacers 210 (310) and the surface of the semiconductor substrate 200 (300) at both sides of the sidewall spacers 210 (310); and forming the source and drain regions by performing an ion implantation process on the source and drain material layer 213 (313) and the semiconductor substrate 200 (300) at both sides of the sidewall spacers 210 (310). The source and drain regions may include the source and drain material layer 213 (313) doped with impurity ions on the surfaces of the sidewall spacers 210 (310) and the surface of the semiconductor substrate 200 (300) at both sides of the sidewall spacers 210 (310) and doping regions 212 (312) in the semiconductor substrate 200 (300) at both sides of the sidewall spacers 210 (310). The semiconductor material layer 211 (311) may be made of any appropriate material, such as polysilicon, silicon germanium, or silicon carbide, etc.

Referring to FIG. 8, for the buried-channel MOSFET (surface-channel MOSFET), after forming the source and drain material layer 213 (313), the patterned hard mask layer 207 (307) may be removed. Before performing the ion implantation process, the source and drain material layer 213 (313) and the semiconductor substrate 200 (300) at both sides of the sidewall spacers 210 (310), a photoresist layer 220 may be formed on the gate electrode 209 of the buried-channel MOSFET. Therefore, the gate electrode 209 of the buried-channel MOSFET may not be doped when performing the ion implantation process; and the gate electrode 309 of the surface-channel MOSFET may be doped when performing the ion implantation process. Thus, the buried-channel MOSFET and the surface-channel MOSFET of the same type (e.g. NMOS or PMOS) and different gate electrodes (e.g. P-type gate electrode for buried-channel NMOS and N-type gate electrode for surface-channel NMOS) may be formed on the same wafer.

The gate electrode of the buried-channel MOSFET may also be configured as a floating-gate material for forming a floating-gate memory (pFlash). FIG. 9 illustrates a schematic of forming the floating-gate memory with the gate electrode or material of the gate electrode of the buried-channel MOSFET as a floating-gate material. Referring to FIG. 9, the gate electrode of the buried-channel MOSFET may be configured as the floating gate, and the gate electrode of the surface-channel MOSFET may be configured as the select gate. The floating gate may be doped by an ion implantation process, and the floating gate implantation area may be larger than the floating gate area. The floating gate and the select gate may be electrically isolated from each other through a dielectric layer. The select gate may be configured to apply a voltage, and the floating gate may be floated. For NMOS transistors, when an elevated voltage is applied on the select gate, electrons may flow from the source region to the drain region of the surface-channel MOSFET. When the source to drain current of the surface-channel MOSFET is sufficiently high, high level electrons may punch through the insulating layer and get stuck in the floating gate of the buried-channel MOSFET. Because the floating gate of the buried-channel MOSFET is electrically isolated, charges trapped in the floating gate may be retained for long periods of time.

For constructing integrated circuits, the buried-channel MOSFET and the surface-channel MOSFET may need to be arranged on the wafer to form a CMOS device. In one embodiment, the n-type and p-type buried-channel MOSFETs may be alternatively arranged in one row; and the n-type and p-type surface-channel MOSFETs may be alternatively arranged in one row. At the same time, the n-type buried-channel MOSFET and the p-type surface-channel MOSFET may be arranged in one column; and the p-type buried-channel MOSFET and the n-type surface-channel MOSFET may be arranged in one column. Other arrangements may also be used.

As shown in FIG. 7, in one embodiment, the source and drain regions of the buried-channel MOSFET (surface-channel MOSFET) may include the source and drain material layer 213 (313) doped with impurity ions on the surfaces of the sidewall spacers 210 (310), the surface of the semiconductor substrate 200 (300) at both sides of the sidewall spacers 210 (310), and the doping regions 212 (312) contacting with the source and drain material layer in the semiconductor substrate 200 (300) at both sides of the sidewall spacers 210 (310). Because portions of the source and drain material layer 213 (313) may be formed on the surface of the semiconductor substrate 200 (300) and the other part of the source and drain material layer 213 (313) may be formed on the surfaces of the sidewall spacers 210 (310), the source and drain material layer 213 (313) may provide sufficient contact space for subsequently formed metal plugs electrically connected with the source and drain regions and provide sufficient carriers for the conduction of the MOSFET. The lateral dimensions of the source and drain regions occupied on the semiconductor substrate in the MOSFET consistent with the disclosed embodiments may be relatively smaller than the lateral dimensions of the source and drain regions occupied in the existing MOSFET, which can improve the integration of devices.

As shown in FIG. 7, in one embodiment, the source and drain material layer 213 (313) can extend over the shallow trench isolation region 201 (301), allowing for electrical contacts to the source and drain regions to be made over the isolation, improving the packing density of the transistors. In addition, the source and drain material layer 213 (313) may extend over the isolation to adjacent source or drain regions of transistors, allowing a local interconnect layer which also improves the packing density of the transistors.

For the buried-channel MOSFET (surface-channel MOSFET), the depth of the doping regions 212 (312) may be larger than the depth of the threshold implantation region 204 and smaller than the depth of the anti-punch-through region 205 (305) and the well area 203 (303). After performing the ion implantation process, the photoresist layer 220 formed on the gate electrode 209 of the buried-channel MOSFET may be removed.

For the buried-channel MOSFET (surface-channel MOSFET), the fabrication process of the source and drain regions may also include: forming a dielectric layer covering the semiconductor substrate 200 (300), the source and drain regions and the gate structure; and forming metal plugs electrically connected with the source and drain regions and the gate electrode 209 (309), respectively, in the dielectric layer.

Further, a buried-channel MOSFET and a surface-channel MOSFET of the same type and different gate electrodes formed on the same wafer may be provided in the present disclosure. In one embodiment, as shown in FIG. 8, the buried-channel MOSFET may include a semiconductor substrate 200, a well area 203 and a plurality of shallow trench isolation structures in the semiconductor substrate. The buried-channel MOSFET may also include a threshold implantation region 204 formed in the well area 203. The type of doped impurity ions in the threshold implantation region 204 may be opposite of the type of doped impurity ions in the well area 203 and the depth of the threshold implantation region 204 may be smaller than the depth of the well area 203.

Further, the buried-channel MOSFET may include a gate structure formed on the surface of the semiconductor substrate 200 above the threshold implantation region 204. The gate structure may include a gate dielectric layer 208 and a gate electrode 209 above the gate dielectric layer 208. The gate electrode 209 may be doped with impurity ions and the type of doped impurity ions in the gate electrode 209 may be the same as the type of doped impurity ions in the well area 203.

Further, the buried-channel MOSFET may also include a source region and a drain region formed in the semiconductor substrate at both sides of the gate structure. The type of doped impurity ions in the source and drain regions may be opposite of the type of doped impurity ions in the well area and the depth of the source and drain regions may be smaller than the depth of the well area and larger than the depth of the threshold implantation region.

The gate structure may also include sidewall spacers 210 formed at both side surfaces of the gate dielectric layer 208 and the gate electrode 209. The source and drain regions may include the source and drain material layers 213 doped with impurity ions on the surfaces of the sidewall spacers 210 and the surface of the semiconductor substrate 200 at both sides of the sidewall spacers 210, and doping regions 212 contacting with the source and drain material layers in the semiconductor substrate 200 at both sides of the sidewall spacers 210.

In one embodiment, the formed buried-channel MOSFET may be an N-type FET, the type of doped impurity ions in the well area may be P-type, the type of doped impurity ions in the threshold implantation region may be N-type, the type of doped impurity ions in the gate electrode may be P-type, and the type of doped impurity ions in the source and drain regions may be N-type.

In another embodiment, the formed buried-channel MOSFET may be a P-type FET, the type of doped impurity ions in the well area may be N-type, the type of doped impurity ions in the threshold implantation region may be P-type, the type of doped impurity ions in the gate electrode may be N-type, and the type of doped impurity ions in the source and drain regions may be P-type.

In one embodiment, as shown in FIG. 8, the surface-channel MOSFET may include a semiconductor substrate 300, a well area 303 and a plurality of shallow trench isolation structures in the semiconductor substrate. The surface-channel MOSFET may also include a gate structure formed on the surface of the semiconductor substrate 300. The gate structure may include a gate dielectric layer 308 and a gate electrode 309 above the gate dielectric layer 308. Further, the surface-channel MOSFET may include a source region and a drain region formed in the semiconductor substrate at both sides of the gate structure. The gate electrode 309 and the source and drain regions may be doped with impurity ions by the same ion implantation process, and the type of doped impurity ions may be opposite to the type of doped impurity ions in the well area 303.

The gate structure may also include sidewall spacers 310 formed at both side surfaces of the gate dielectric layer 308 and the gate electrode 309. The source and drain regions may include the source and drain material layers 313 doped with impurity ions on the surfaces of the sidewall spacers 310 and on the surface of the semiconductor substrate 300 at both sides of the sidewall spacers 310, and doping regions 312 contacting with the source and drain material layers 313 in the semiconductor substrate 300 at both sides of the sidewall spacers 310.

In one embodiment, the formed surface-channel MOSFET may be an N-type FET, the type of doped impurity ions in the well area may be P-type, the type of doped impurity ions in the gate electrode may be N-type, and the type of doped impurity ions in the source and drain regions may be N-type.

In another embodiment, the formed surface-channel MOSFET may be a P-type FET, the type of doped impurity ions in the well area may be N-type, the type of doped impurity ions in the gate electrode may be P-type, and the type of doped impurity ions in the source and drain regions may be P-type.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to 10 those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a semiconductor substrate for forming a buried-channel metal-oxide-semiconductor field-effect transistor (MOSFET) and a surface-channel MOSFET, wherein the buried-channel MOSFET and the surface-channel MOSFET are of a same type with different gate electrodes on a same wafer;
   forming a well region and a plurality of shallow trench isolation structures in the semiconductor substrate;
   forming a threshold implantation region and an anti-punch-through region, inside the well region for the buried-channel MOSFET, wherein
   the threshold implantation region has a distance from a top surface of the well region,
   a type of doped impurity ions in the threshold implantation region is opposite of a type of doped impurity ions in the well region,
   a depth of the threshold implantation region is smaller than a depth of the well region, and
   a depth of the anti-punch-through region is larger than the depth of the threshold implantation region and smaller than the depth of the well region;
   forming a gate structure on a surface of the semiconductor substrate for each buried-channel and surface-channel MOSFETs, wherein the gate structure includes a gate dielectric layer and a gate electrode above the gate dielectric layer, the gate electrode of the buried-channel MOSFET is doped with impurity ions and a type of doped impurity ions in the gate electrode of the buried-channel MOSFET is the same as the type of doped impurity ions in the well region, and a type of doped impurity ions in the gate electrode of the surface-channel MOSFET is opposite of the type of doped impurity ions in the well region; and
   forming a source region and a drain region in the semiconductor substrate at both sides of the gate structure for each buried-channel and surface-channel MOSFETs, wherein a type of doped impurity ions in the source and drain regions is opposite of the type of doped impurity ions in the well region, and a depth of the source and drain regions is smaller than the depth of the well region and larger than the depth of the threshold implantation region.

2. The method according to claim 1, wherein:
the buried-channel MOSFET and surface-channel MOSFET are N-type FETs;
the type of doped impurity ions in the well region for each buried-channel and surface-channel MOSFETs is P-type;
the type of doped impurity ions in the threshold implantation region for the buried-channel MOSFET is N-type;
the type of doped impurity ions in the source and drain regions for each buried-channel and surface-channel MOSFETs is N-type;
the type of doped impurity ions in the gate electrode for the buried-channel MOSFET is P-type; and
the type of doped impurity ions in the gate electrode for the surface-channel MOSFET is N-type.

3. The method according to claim 1, wherein:
the buried-channel MOSFET and surface-channel MOSFET are P-type FETs;
the type of doped impurity ions in the well region for each buried-channel and surface-channel MOSFETs is N-type;
the type of doped impurity ions in the threshold implantation region for the buried-channel MOSFET is P-type;
the type of doped impurity ions in the source and drain regions for each buried-channel and surface-channel MOSFETs is P-type;
the type of doped impurity ions in the gate electrode for the buried-channel MOSFET is N-type; and
the type of doped impurity ions in the gate electrode for the surface-channel MOSFET is P-type.

4. The method according to claim 2, wherein:
the N-type impurity ion is one or more of phosphorus ion, arsenic ion, and antimony ion; and
the P-type impurity ion is one or more of boron ion, gallium ion, and indium ion.

5. The method according to claim 1, wherein:
the threshold implantation region of the buried-channel MOSFET is formed by an ion implantation process.

6. The method according to claim 1, wherein:
the threshold implantation region of the buried-channel MOSFET is located inside the semiconductor substrate, and both regions above and below the threshold implantation region are well regions with opposite doping types to the threshold implantation region;
a PN junction is formed in the contact area between the threshold implantation region and the well region; and
an inversion region is formed in the area near the PN junction when an operating voltage is applied onto the gate electrode.

7. The method according to claim 1, wherein:
a width of the threshold implantation region of the buried-channel MOSFET is larger than a width of the gate electrode.

8. The method according to claim 1, wherein forming the gate structure of the buried-channel and surface-channel MOSFETs further includes:
forming a gate dielectric material layer on a surface of the semiconductor substrate;
forming a gate electrode material layer on a surface of the gate dielectric material layer, wherein the gate electrode material layer of the buried-channel MOSFET is doped with impurity ions by an ion implantation process;
forming a patterned hard mask layer on a surface of the gate electrode material layer;
using the patterned hard mask layer as a mask to etch the gate electrode material layer and the gate dielectric material layer; and
forming the gate dielectric layer and the gate electrode on the surface of the semiconductor substrate.

9. The method according to claim 8, wherein:
a photoresist layer is formed on the gate electrode material layer of the surface-channel MOSFET before performing the ion implantation process; and
the photoresist layer is removed after performing the ion implantation process.

10. The method according to claim 1,
wherein a type of doped impurity ions in the anti-punch-through region is the same as the type of doped impurity ions in the well.

11. The method according to claim 1, wherein forming the buried-channel and surface-channel MOSFETs further includes:
forming sidewall spacers on both side surfaces of the gate electrode and the gate dielectric layer.

12. The method according to claim 11, wherein:
the gate structure for each buried-channel and surface-channel MOSFETs also includes sidewall spacers at both side surfaces of the gate dielectric layer and the gate electrode.

13. The method according to claim 8, wherein forming the source and drain regions of the buried-channel and surface-channel MOSFETs further includes:
forming a semiconductor material layer covering the semiconductor substrate, the gate structure and the patterned hard mask layer above the gate structure;
removing the semiconductor material layer on a surface of the patterned hard mask layer and portions of the semiconductor material layer on the semiconductor substrate by an etching process;
forming source and drain material layers on surfaces of the sidewall spacers and on the surface of the semiconductor substrate at both sides of the sidewall spacers;
removing the patterned hard mask layer;
forming a photoresist layer on the gate electrode of the buried-channel MOSFET; and
forming the source and drain regions by performing an ion implantation process on the source and drain material layers and the semiconductor substrate at both sides of the sidewall spacers.

14. The method according to claim 13, wherein:
the semiconductor material layer is made of polysilicon, silicon germanium, or silicon carbide.

15. The method according to claim 1, wherein:
the gate electrode of the buried-channel MOSFET is configured for forming a floating-gate memory.

16. The method according to claim 1, wherein
the gate dielectric material layer is made of silicon oxide, silicon nitride, or silicon oxynitride.

17. The method according to claim 1, wherein
a portion of the well region is above the threshold implantation region, and other portion of the well region is below the threshold implantation region.

* * * * *